(12) United States Patent
Fukuyoshi et al.

(10) Patent No.: US 9,006,881 B2
(45) Date of Patent: Apr. 14, 2015

(54) SEMICONDUCTOR DEVICE

(71) Applicant: Kabushiki Kaisha Toshiba, Minato-ku (JP)

(72) Inventors: Hiroshi Fukuyoshi, Hyogo-ken (JP); Junichi Nakao, Hyogo-ken (JP); Yoshiki Endo, Hyogo-ken (JP); Eitaro Miyake, Hyogo-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 14/019,087

(22) Filed: Sep. 5, 2013

(65) Prior Publication Data
US 2014/0284786 A1 Sep. 25, 2014

(30) Foreign Application Priority Data

Mar. 25, 2013 (JP) .................................. 2013-061864

(51) Int. Cl.
*H01L 23/34* (2006.01)
*H01L 23/00* (2006.01)

(52) U.S. Cl.
CPC ............... *H01L 23/34* (2013.01); *H01L 24/34* (2013.01); *H01L 2224/48091* (2013.01); *H01L 2224/73265* (2013.01); *H01L 2224/8592* (2013.01)

(58) Field of Classification Search
CPC ........................... H01L 23/34; H01L 23/3135
USPC .................................. 257/712, 718, 727, 730
See application file for complete search history.

(56) References Cited

U.S. PATENT DOCUMENTS

| 5,940,271 | A | * | 8/1999 | Mertol | 361/704 |
| 6,087,682 | A | * | 7/2000 | Ando | 257/178 |
| 6,285,086 | B1 | | 9/2001 | Sota et al. | |
| 2002/0038873 | A1 | * | 4/2002 | Hiyoshi | 257/197 |
| 2009/0261462 | A1 | * | 10/2009 | Gomez | 257/673 |
| 2013/0010440 | A1 | | 1/2013 | Saito et al. | |

FOREIGN PATENT DOCUMENTS

| JP | 2006-032617 A | 2/2006 |
| JP | 2006-351737 A | 12/2006 |

* cited by examiner

*Primary Examiner* — Tu-Tu Ho
(74) *Attorney, Agent, or Firm* — White & Case LLP

(57) ABSTRACT

An aspect of the present embodiment, there is provided a semiconductor device, including an insulating substrate, at least one semiconductor chip provided above the insulating substrate, a wiring terminal including a connection portion electrically connected to the semiconductor chip, a surrounding frame surrounding the semiconductor chip and the connection portion, an embedded material provided in the surrounding frame covering the semiconductor chip and the connection portion, and a pressing unit provided on a surface of the embedded material.

15 Claims, 4 Drawing Sheets

| cycle | 10000 | 20000 | 30000 | 40000 | 50000 | 60000 | 70000 |
|---|---|---|---|---|---|---|---|
| C | 0/10 | 0/10 | 2/10 | — | — | — | — |
| E | 0/10 | 0/10 | 0/10 | 0/10 | 0/10 | 0/10 | 1/10 |

C···Conventinal Case      E···Embodiment 1

FIG.6

SEMICONDUCTOR DEVICE

CROSS REFERENCE TO RELATED APPLICATION

This application is based upon and claims the benefit of priority from prior Japanese Patent Application No. 2013-061864, filed on Mar. 25, 2013, the entire contents of which are incorporated herein by reference.

FIELD

Exemplary embodiments described herein generally relate to a semiconductor device.

BACKGROUND

Conventional power semiconductor devices include at least a semiconductor chip and a wiring terminal in which placed a connection portion electrically connected to the semiconductor chip.

Such the semiconductor device has probability of generating degradation in the connection portion when a temperature test, for example, TFT (Thermal Fatigue Test) is conducted.

Warpage is generated in a bell connection portion, for example, or crack is generated in the jointing material, for example, solder, which joints a semiconductor chip and the connection portion.

BRIEF DESCRIPTION OF THE DRAWINGS

FIG. 6 is a table showing results of thermal fatigue tests according to the first embodiment and a conventional case, respectively.

DETAILED DESCRIPTION

An aspect of the present embodiment, there is provided a semiconductor device, including an insulating substrate, at least one semiconductor chip provided above the insulating substrate, a wiring terminal including a connection portion electrically connected to the semiconductor chip, a surrounding frame surrounding the semiconductor chip and the connection portion, an embedded material provided in the surrounding frame covering the semiconductor chip and the connection portion, and a pressing unit provided on a surface of the embedded material.

Embodiments will be described below in detail with reference to the attached drawings mentioned above.

First Embodiment

Figure 1:
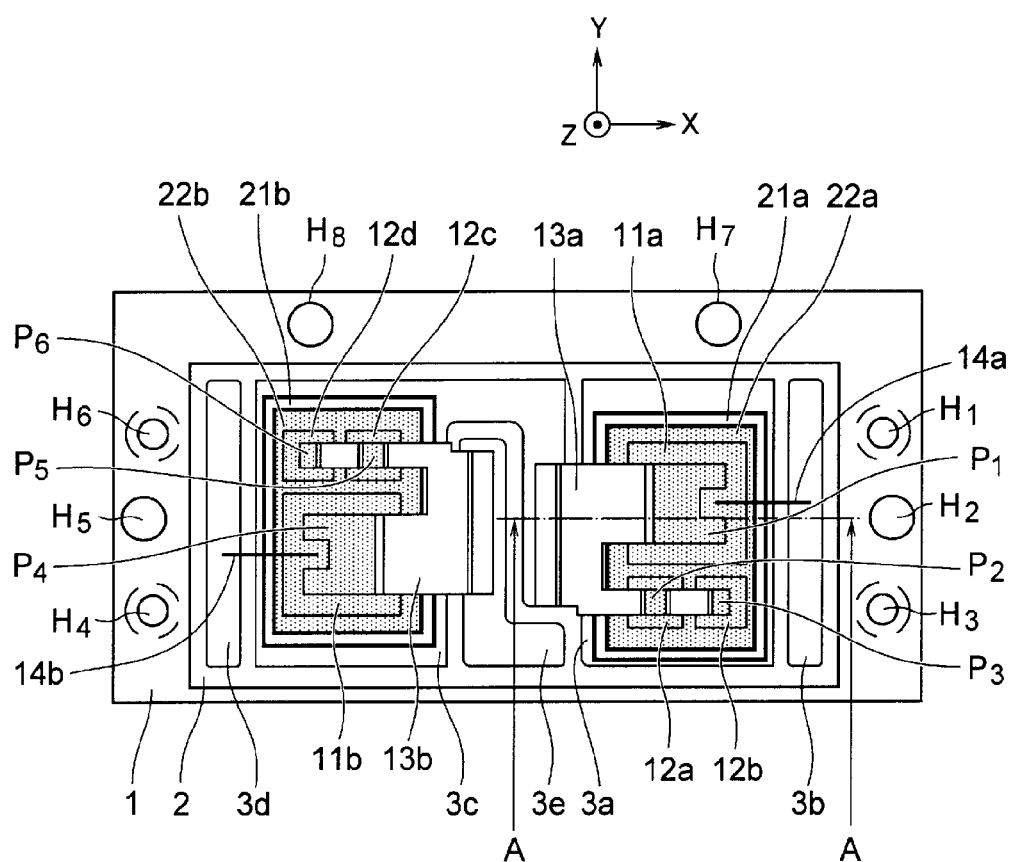
FIG. 1 is a plane view showing a structure of a semiconductor device according to a first embodiment.
Figure 2:
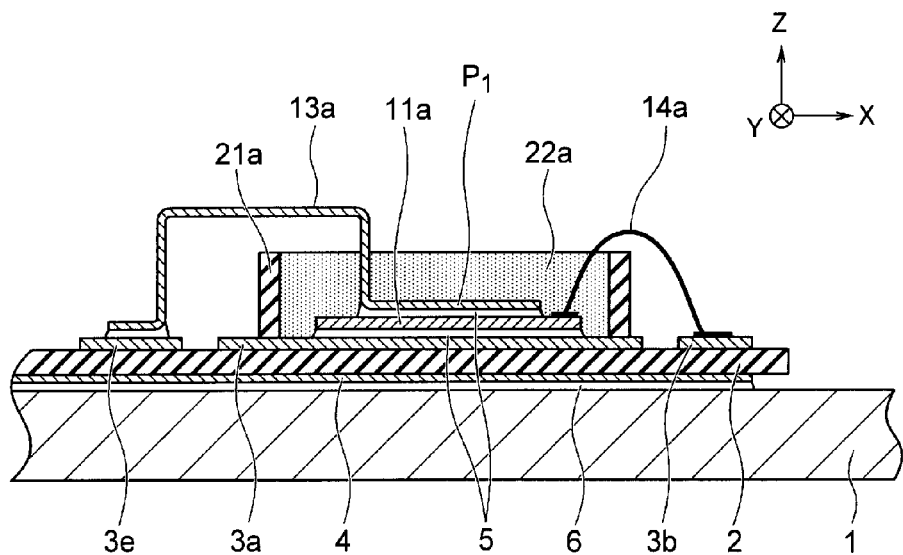
FIG. 2 is a cross-sectional view along a line A-A in FIG. 1 showing the structure of the semiconductor device according the first embodiment.

FIG. 1 is a plane view showing a structure of a semiconductor device. FIG. 2 is a cross-sectional view along a line A-A.

The structure of the semiconductor device according the first embodiment is described in reference to FIG. 1 mainly and to FIG. 2 in necessary.

As shown in FIG. 1, the semiconductor device according the first embodiment includes a heat sink plate 1, an insulating substrate 2, front surface conduction films 3a-3e, a back surface conduction film 4 in reference to FIG. 2, IGBT (Insulated Gate Bipolar Transistor) chips 11a, 11b, FRD (Fast Recovery Diode) chips 12a-12d, wiring terminals 13a, 13b, bonding wires 14a, 14b, surrounding frames 21a, 21b and embedded materials 22a, 22b.

The front surface conduction films 3a-3e are formed above a front surface of the insulating substrate 2 and the back surface conduction film 4 is formed on a back surface of the insulating substrate 2. The insulating substrate 2 is composed of a ceramic substrate or the like, for example. The front surface conduction films 3a-3e and the back surface conduction film 4 are metal plates composed of metal, for example.

The insulating substrate 2 is placed on above the heat sink plate 1 through the back surface conduction film 4. The insulating substrate 2 is jointed to the heat sink plate 1 by a jointing material 6, in reference FIG. 2. The heat sink plate 1 is composed of metal having high thermal conductivity, for example. The jointing material 6 is composed of solder, metal having excellent thermal conductivity, for example, silver paste, copper paste or the like. Marks $H_1$-$H_8$ show screw holes formed in the heat sink plate 1.

Three directions are showed in FIG. 1, where X-direction and Y-direction are in parallel to main surfaces of the heat sink plate 1 and the insulating substrate 2, and are vertically set each other, and Z-direction is vertically set to the main surfaces of the heat sink plate 1 and the insulating substrate 2. +Z-direction and -Z-direction are dealt with an upper direction and a lower direction, respectively in the specification. A relationship between positions of the heat sink plate 1 and insulating substrate 2 is represented that the heat sink plate 1 is positioned under the insulating substrate 2, for example.

The IGBT chip 11a and the FRD chips 12a, 12b are placed above the insulating substrate 2 through the front surface conduction film 3a. The IGBT chip 11b and the FRD chip 12c, 12d are placed above the insulating substrate 2 through the front surface conduction film 3c.

Each of the IGBT chips 11a, 11b is a semiconductor chip including a transistor called IGBT. Each of the FRD chips 12a-12d is a semiconductor chip including a diode called FRD. The IGBT chips 11a, 11b and FRD chips 12a-12d are electrically connected to the front surface conduction film 3a, 3c through the jointing material 5 in reference to FIG. 2. The jointing material 5 is composed of solder, conductive metal, for example, silver paste, copper paste or the like.

The wiring terminal 13a includes a connection portion $P_1$ electrically connected to the IGBT chip 11a, a connection portion $P_2$ electrically connected to the FRD chip 12a, the connection portion $P_3$ electrically connected to the FRD chip 12b. Further, the wiring terminal 13a is electrically connected to the front surface conduction film 3c.

The wiring terminal 13b includes a connection portion $P_4$ electrically connected to the IGBT chip 11b, a connection portion $P_5$ electrically connected to the FRD chip 12c, and a connection portion $P_6$ electrically connected to the FRD chip 12d. Further, the wiring terminal 13b is electrically connected to the front surface conduction film 3e.

The wiring terminals 13a, 13b are composed of metal, for example. The connection portions $P_1$-$P_6$ of the wiring terminals 13a, 13b are electrically connected to IGBT chips 11a, 11b and the FRD chips 12a, 12d by jointing material 5 in reference to FIG. 2.

The IGBT chip 11a and the FRD chips 12a, 12b are connected in parallel by the front surface conduction film 3a and the wiring terminal 13a. Further, the IGBT chip 11b and the FRD chips 12c, 12d are connected in parallel by the front surface conduction film 3c and the wiring terminal 13b.

The bonding wire 14a electrically connects the IGBT chip 11a and the front surface conduction film 3b. Further, the bonding wire 14b electrically connects the IGBT chip 11b and the front surface conduction film 3d. The bonding wires 14a, 14b are connected to gates of the IGBT chip 11a, 11b, respectively. The bonding wires 14a, 14b are composed of bonding wires made of aluminum having a diameter of 350 μm.

The bonding wire 14a is exactly not represented in cross-sectional view in FIG. 2, however, is shown in FIG. 2 for convenience in explanation. Such the situation is the same in FIG. 3 described later.

The surrounding frames 21a, 21b have circular shapes. The surrounding frame 21a is placed above the insulating substrate 2 through the front surface conduction film 3a and surrounds the IGBT chip 11a, the FRD chips 12a, 12b and the connection portions $P_1$-$P_3$. The surrounding frame 21b is placed above insulating substrate 2 through the front surface conduction film 3c and surrounds the IGBT chip 11b, the FRD chip 12c, 12d and the connection portions $P_4$-$P_6$.

The surrounding frames 21a, 21b are composed of insulating material in the first embodiment. The insulating material is resin or ceramics, for example. The surrounding frames 21a, 21b are connected to the front surface conduction films 3a, 3c by a jointing material, silicone resin, epoxy resin, solder, for example, silver paste, copper paste, or the like.

The surrounding frames 21a, 21b can be composed of conductive material such as metal. In such the case, it is desirable that a distance between the surrounding frames 21a, 21b is set to be wider than the bonding wires 14a, 14b to ensure insulation quality between the surrounding frames 21a, 21b and the bonding wires 14a, 14b.

The embedded material 22a is embedded in the surrounding frame 21a to cover the IGBT chip 11a, the FRD chips 12a, 12b and the connection portions $P_1$-$P_3$. The embedded material 22b is embedded in the surrounding frame 21b to cover the IGBT chip 11b, the FRD chips 12c-12d and the connection portion $P_4$-$P_6$.

The embedded materials 22a, 22b are composed of resin in the first embodiment. The resin is an epoxy resin, for example. The embedded materials 22a, 22b are formed by injecting liquid of the epoxy resin into the surrounding frames 21a, 21b to solidify the liquid of the epoxy resin. The embedded materials 22a, 22b can be an insulating material other than epoxy resin, where the insulating material has hardness including ability to transmit load.

Each of the embedded materials 22a, 22b are embedded after the bonding wires 14a, 14b are connected. Because, the bonding wires 14a, 14b cannot be connected to the IGBT chips 11a, 11b, when the embedded materials 22a, 22b are embedded before connecting the bonding wires 14a, 14b. Accordingly, each of the bonding wires 14a, 14b is partially embedded in the embedded materials 22a, 22b as shown in FIG. 2.

Regions of the embedded materials 22a, 22b are shown by dots in FIGS. 1, 2. In FIG. 1, outlines of the IGBT chips 11a, 11b, the FRD chips 12a-12d, and of the connection portions $P_1$-$P_6$ covered with the embedded materials 22a, 22b are shown without deleting for convenience of the explanation.

Figure 3:
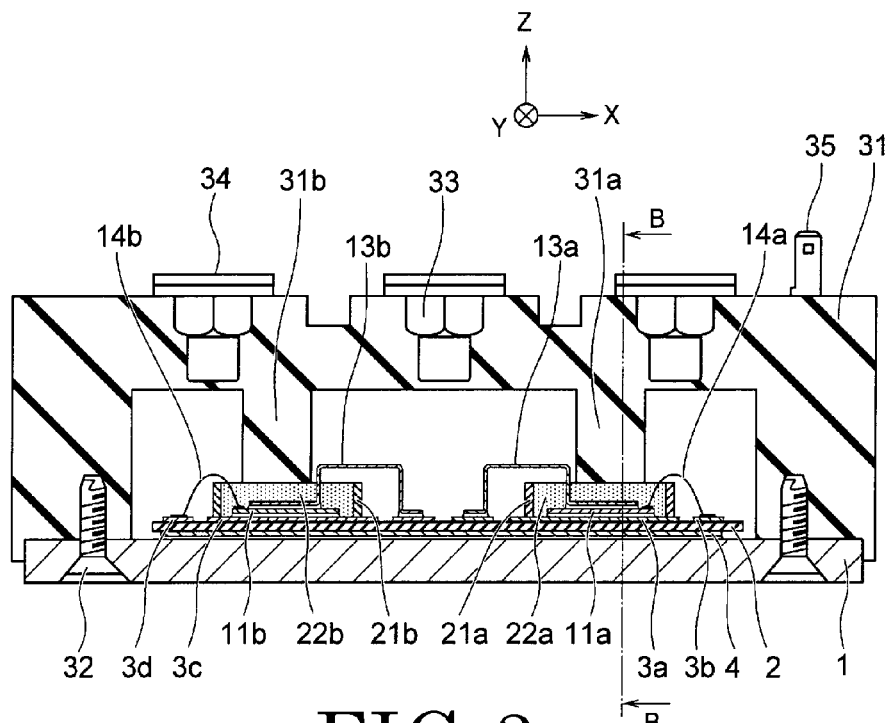
FIG. 3 is a cross-sectional view showing the structure of the semiconductor device according the first embodiment.
Figure 4:
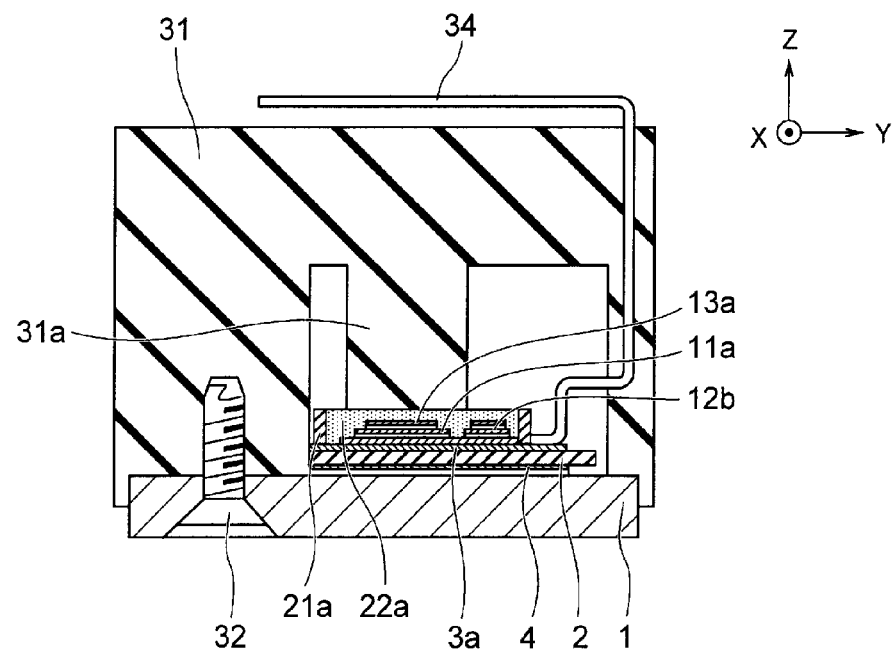
FIG. 4 is a cross-sectional view along a line B-B in FIG. 3 showing the structure of the semiconductor device according the first embodiment.

FIG. 3 is a cross-sectional view showing the structure of the semiconductor device according the first embodiment. FIG. 4 is a cross-sectional view along a line B-B in FIG. 3. The semiconductor device shown in FIGS. 3, 4 is a feature after a housing 31 are fixed on the heat sink plate 1 in FIGS. 1, 2.

The structure of the semiconductor device according the first embodiment is described in reference to FIG. 3 mainly and to FIG. 4 in necessary.

As shown in FIG. 3, the semiconductor device in the first embodiment further includes the housing 31, tapping screws 32, hexagonal nuts 33, an outer power terminal 34 and an outer signal terminal 35.

The housing 31 is fixed to the heat sink plate 1 to cover the insulating substrate 2 and the heat sink plate 1. The heat sink plate 1 and the housing 31 are screwed by tapping screws 32. Further, the heat sink plate 1 and the housing 31 can be screwed other than the tapping screws 32 as another embodiment. The heat sink plate 1 and the housing 31 have screw holes to be screwed the housing 31 with conventional screws. The hexagonal nuts 33, the outer power terminal 34 and the outer signal terminal 35 are fixed to the housing 31. The housing 31 is composed of insulating material, for example, resin in the first embodiment.

The housing 31 in the first embodiment includes pressing units 31a, 31b in positions opposed to the embedded materials 22a, 22b. A length of each of the pressing units 31a, 31b is set that each of the pressing units 31a, 31b and each of the embedded materials 22a, 22b are sufficiently connected, respectively, before the heat sink plate 1 and the housing 31 are fully screwed by the tapping screws 32. Namely, each of the pressing units 31a, 31b is projected in a direction of each of the embedded materials 22a, 22b, respectively. When the heat sink plate 1 and the housing 31 are fully screwed with the tapping screws 32, each of the pressing units 31a, 31b presses each of the embedded materials 22a, 22b to an upper surface of each of the embedded materials 22a, 22b. A projection amount of each of the pressing units 31a, 31b to each of the embedded materials 22a, 22b is 0.1-0.2 mm, for example.

The pressing units 31a, 31b are constituted as parts of the housing 31 in the first embodiment. However, it is not restricted the above case. A member other than the housing 31 can be utilized whenever the member can press the surfaces of the embedded materials 22a, 22b as other embodiment. On the other hand, when the pressing units 31a, 31b is constituted with the part of the housing 31, the pressing units 31a, 31b are not necessary to be prepared other than the housing 31 to be able to decrease product cost of the semiconductor device.

The semiconductor device in the first embodiment is completed to inject silicone gel into the housing 31 after the heat sink plate 1 is screwed by the tapping screws 32.

Figure 5:
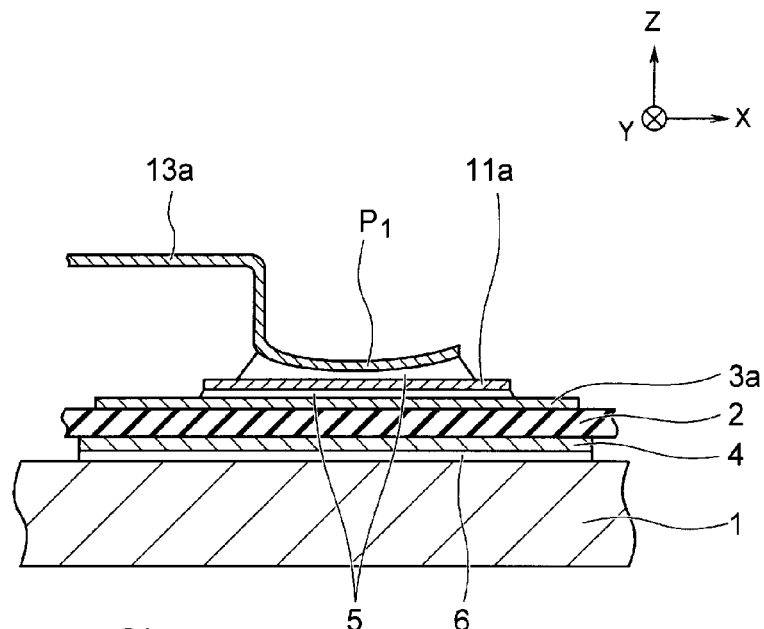
FIG. 5 is a cross-sectional view showing effects of the first embodiment.

Effects of the first embodiment are explained in reference to FIGS. 5, 6.

FIG. 5 is a cross-sectional view showing effect of the first embodiment.

The connection portion $P_1$ pressed by the pressing unit 31a is shown in FIG. 5, before being embedded by the embedded material 22a. In the state, when a temperature cycle test of the semiconductor device is performed, warpage is generated in the connection portion $P_1$ to generate stress which removes the jointing material 5 between the connection portion $P_1$ and the IGBT chip 11a as shown in FIG. 5. Accordingly, when crack is generated in the jointing material 5, degradation such as conductive defect or the like can be generated.

Therefore, the semiconductor device in the first embodiment includes the surrounding frames 21a, 21b surrounding the connection portions $P_1$-$P_6$, the embedded materials 22a, 22b embedded in the surrounding frames 21a, 21b, and the pressing units 31a, 31b pressing the surface of the embedded materials 22a, 22b as shown in FIGS. 1-4.

Accordingly, the embedded materials 22a, 22b in the first embodiment are pressed by the pressing units 31a, 31b to be applied compressive pressure to surfaces thereof. As a result, the compressive pressure performs action to the connection portions $P_1$-$P_6$ and the jointing material 5.

Consequently, stress configured to generate warpage in the connection portions $P_1$-$P_6$ and to remove the jointing material 5 is cancelled by the compressive pressure described above. Therefore, generation of warpage in connection portions $P_1$-$P_6$ and generation of crack in the jointing material 5 can be controlled. As a result, generation of the defects in the connection portions $P_1$-$P_6$ can be controlled when performing the temperature cycle test in the first embodiment.

FIG. 6 is a table showing results of thermal fatigue tests according to the first embodiment and a conventional case, respectively.

Thermal fatigue test in FIG. 6 are performed in a condition of a range between 25-115° C. (ΔTc=90° C.). A number of cumulative defects between ten thousands and seventy thousands in cycles are demonstrated in FIG. 6. The semiconductor device is judged to have a defect or not in described below. It is confirmed that electrical characteristic failure due to crack of the jointing material 5 is generated or not in resolving the semiconductor device after the test.

As shown in FIG. 6, defects are generated below thirty thousands of the cycles in the conventional semiconductor device without the surrounding frames 21a, 21b, the embedded materials 22a, 22b and the pressing units 31a, 31b. Accordingly, the conventional semiconductor device cannot clear a target of sixty thousands of the cycles.

On the other hand, any defect is not generated till seventy thousands cycles in the semiconductor device including the surrounding frames 21a, 21b, the embedded materials 22a, 22b and the pressing units 31a, 31b. Therefore, the semiconductor device in the first embodiment can clear a target of sixty thousands cycles in thermal fatigue test.

As described above, the semiconductor device in the first embodiment includes the semiconductor chips 11a-12d, the surrounding frames 21a, 21b surrounding the connection portions $P_1$-$P_6$, the embedded materials 22a, 22b embedded in the surrounding frames 21a, 21b and pressing units 31a, 31b pressing the surfaces of the embedded materials 22a, 22b.

Accordingly, the semiconductor device having higher reliability to the temperature cycle test can be provided according to the first embodiment.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor device, comprising:
an insulating substrate;
at least one semiconductor chip provided above the insulating substrate;
a wiring terminal including a connection portion electrically connected to the semiconductor chip;
a surrounding frame surrounding the semiconductor chip and the connection portion;
an embedded material provided in the surrounding frame covering the semiconductor chip and the connection portion;
a pressing unit provided on a surface of the embedded material; and
a housing covering the insulating substrate and comprising the pressing unit.

2. The semiconductor device of claim 1, further comprising:
a first jointing material, the connection portion being connected to the semiconductor chip through the first jointing material.

3. The semiconductor device of claim 1, wherein the embedded material is composed of resin.

4. The semiconductor device of claim 1, further comprising:
a heat sink plate and screws, the insulating substrate being above the heat sink plate, the screws screwing the heat sink plate and the housing.

5. The semiconductor device of claim 1, further comprising:
a bonding wire which is partially provided in the embedded material and is electrically connected to the semiconductor chip.

6. The semiconductor device of claim 5, wherein the surrounding frame is provided above the insulating substrate through a front surface conduction film.

7. The semiconductor device of claim 1, further comprising:
a front surface conduction film and a second jointing material, the front surface conduction film being provided on the insulating substrate, the semiconductor chip being provided above the front surface conduction film through the second jointing material.

8. The semiconductor device of claim 1, wherein the pressing unit is composed of resin.

9. The semiconductor device of claim 1, wherein the pressing unit is projected in a direction of the embedded material.

10. The semiconductor device of claim 9, wherein a projection amount of the pressing units in the direction of the embedded material has a length of 1-2 mm.

11. The semiconductor device of claim 1, wherein the embedded material is pressed by the pressing units to be applied compressive pressure.

12. The semiconductor device of claim 11, wherein the compressive pressure performs action to the connection portion and a first jointing material.

13. The semiconductor device of claim 1, wherein at least a chip selected from an IGBT chip and an FRD chip is included in the semiconductor chip.

14. The semiconductor device of claim 1, wherein the surrounding frame has a circular shape.

15. The semiconductor device of claim 1, wherein the surrounding frame is composed of an insulating material or a conductive material.

* * * * *